(12) United States Patent
Ho

(10) Patent No.: US 12,245,419 B2
(45) Date of Patent: Mar. 4, 2025

(54) METHOD FOR PREPARING MEMORY DEVICE HAVING PROTRUSION OF WORD LINE

(71) Applicant: NANYA TECHNOLOGY CORPORATION, New Taipei (TW)

(72) Inventor: Jar-Ming Ho, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 371 days.

(21) Appl. No.: 17/824,507

(22) Filed: May 25, 2022

(65) Prior Publication Data

US 2023/0389282 A1    Nov. 30, 2023

(51) Int. Cl.
*H01L 27/108* (2006.01)
*H10B 12/00* (2023.01)

(52) U.S. Cl.
CPC ........... *H10B 12/312* (2023.02); *H10B 12/03* (2023.02); *H10B 12/482* (2023.02); *H10B 12/488* (2023.02)

(58) Field of Classification Search
CPC ...................................................... H10B 12/03
See application file for complete search history.

(56) References Cited

U.S. PATENT DOCUMENTS

| 2007/0087499 | A1* | 4/2007 | Seo | ................... H01L 29/66666 257/E21.655 |
| 2014/0035018 | A1 | 2/2014 | Lee | |
| 2021/0296320 | A1 | 9/2021 | Sandhu | |
| 2023/0389282 | A1 | 11/2023 | Ho | |

FOREIGN PATENT DOCUMENTS

| TW | 202201741 A | 1/2022 |
| TW | 202205634 A | 2/2022 |

OTHER PUBLICATIONS

Taiwanese Office Action dated May 16, 2023 in application No. 111127609, the search report attached to the Office Action; pp. 1-9.

* cited by examiner

*Primary Examiner* — Walter H Swanson
(74) *Attorney, Agent, or Firm* — Muncy, Geissler, Olds & Lowe, P.C.

(57) ABSTRACT

The present disclosure provides a method for preparing a memory device. The method includes forming a first bottom cell within a bottom substrate, comprising: forming a first bottom capacitor within the bottom substrate; forming a first bottom word line on the bottom substrate and extending along a first direction; and forming a first bottom channel layer surrounded by the first bottom word line. The method also includes forming a first top cell within a top substrate, comprising: forming a first top capacitor within the top substrate; forming a first top word line on the top substrate and extending along the first direction; and forming a first top channel layer surrounded by the first top word line. The method further includes forming a common bit line between the first bottom cell and the first top cell and extending along a second direction substantially perpendicular to the first direction.

13 Claims, 17 Drawing Sheets

METHOD FOR PREPARING MEMORY DEVICE HAVING PROTRUSION OF WORD LINE

TECHNICAL FIELD

The present disclosure relates to a method for preparing a memory device, and in particularly to a method for preparing a memory device including a word line with a protruding portion.

DISCUSSION OF THE BACKGROUND

With the rapid growth of the electronics industry, the development of integrated circuits (ICs) has achieved high performance and miniaturization. Technological advances in IC materials and design have produced generations of ICs where each generation has smaller and more complex circuits than the previous generation.

A Dynamic Random Access Memory (DRAM) device is a type of random access memory that stores each bit of data in a separate capacitor within an integrated circuit. Typically, a DRAM is arranged in a square array of one capacitor and transistor per cell. A vertical transistor has been developed for the $4F^2$ DRAM cell, where F stands for the photolithographic minimum feature width or critical dimension (CD). However, recently, DRAM manufacturers face the tremendous challenge of shrinking the memory cell area as the word line spacing continues to shrink. For example, the channel of a bit line is prone to be in contact with a word line, thereby inducing a short due to an overlay error of a lithography process.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a memory device. The memory device includes a substrate, a dielectric layer, a first metallization layer, a first channel layer, a second metallization layer, and a second channel layer. The dielectric layer is disposed on the substrate. The first metallization layer is disposed within the dielectric layer and extends along a first direction. The first channel layer is surrounded by the first metallization layer. The second metallization layer is disposed within the dielectric layer and extends along the first direction. The second channel layer is surrounded by the second metallization layer. The first metallization layer includes a first protruding portion protruding toward the second metallization layer.

Another aspect of the present disclosure provides another memory device. The memory device includes a bottom substrate, a first bottom cell, a top substrate, a first top cell, and a common bit line. The first bottom cell includes a first bottom capacitor disposed within the bottom substrate. The first bottom cell also includes a first bottom word line disposed on the bottom substrate and extending along a first direction. The first bottom cell further includes a first bottom channel layer surrounded by the first bottom word line. The first top cell includes a first top capacitor disposed within the top substrate. The first top cell also includes a first top word line disposed on the top substrate and extending along the first direction. The first top cell further includes a first top channel layer surrounded by the first top word line. The common bit line is disposed between the first bottom cell and the first top cell and extends along a second direction substantially perpendicular to the first direction.

Another aspect of the present disclosure provides a method for manufacturing a memory device. The method includes providing a substrate. The method also includes forming a conductive layer on the substrate. The method further includes patterning the conductive layer to form a first metallization layer and a second metallization layer extending along a first direction. The first metallization layer has a first protruding portion protruding toward the second metallization layer. In addition, the method includes forming a first channel layer within the first metallization layer and a second channel layer within the second metallization layer.

The embodiments of the present disclosure provide a memory device. The memory device may include a word line with a protruding portion. The protruding portion may allow a relatively great overlay error of patterning the word line to form an opening within which a channel layer is formed, which may prevent electrical leakage between the word line and the channel layer.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1A:
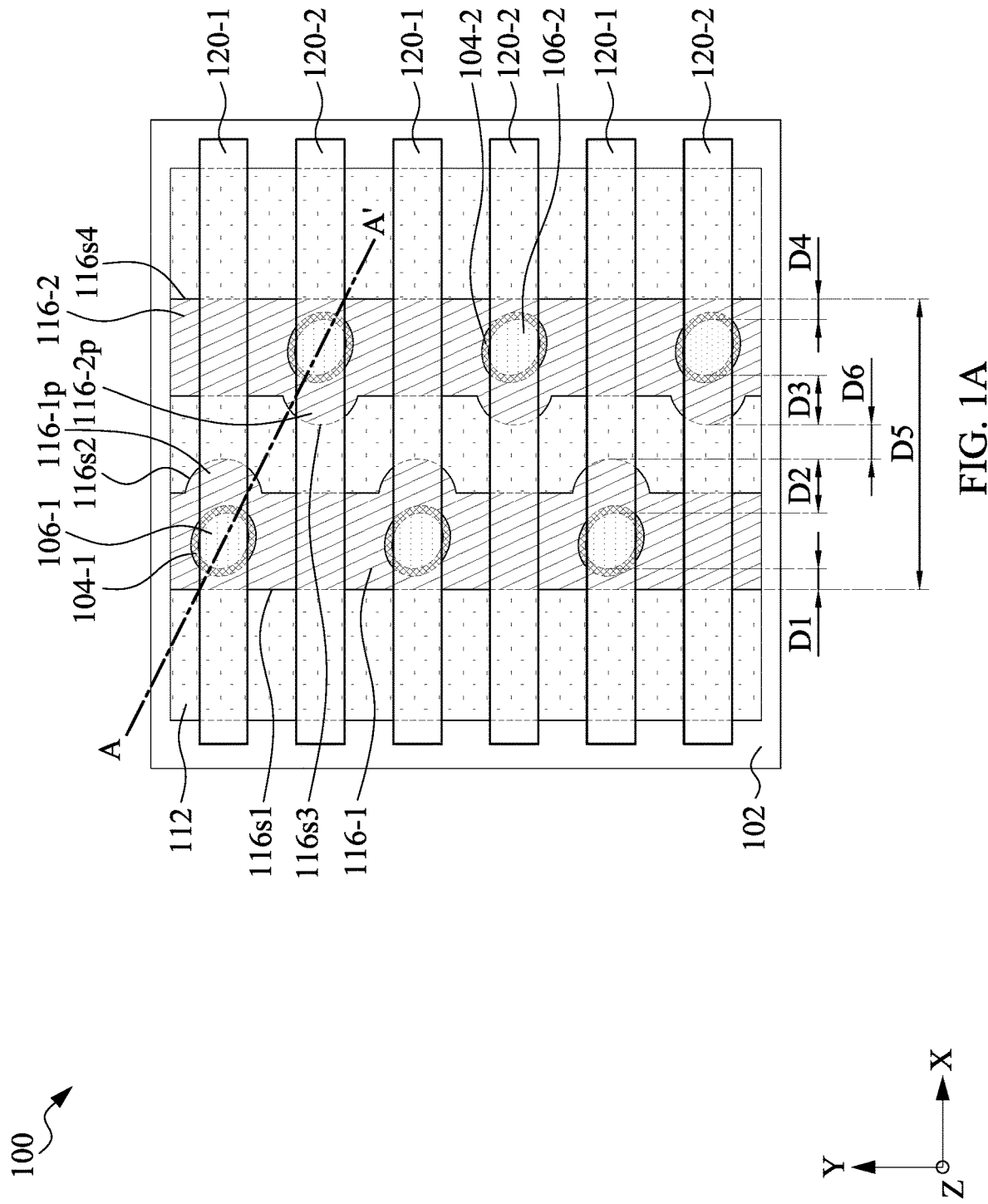
FIG. 1A is a top view of a memory device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that may occur, for example, through typical measuring and liquid handling procedures used for making concentrates or solutions. Furthermore, variation may occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1A is a top view of a memory device 100, in accordance with some embodiments of the present disclosure.

Figure 1B:
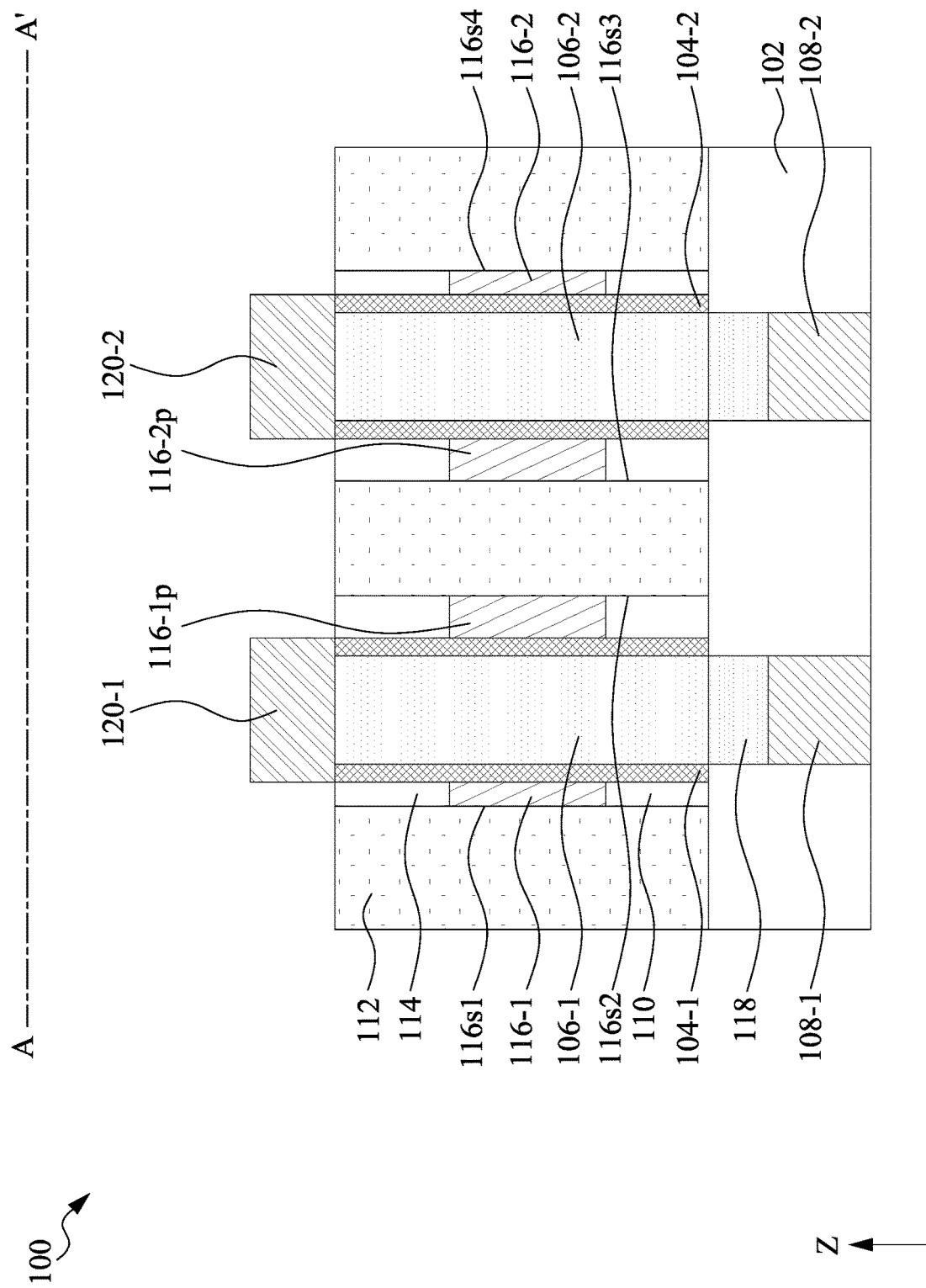
FIG. 1B is a cross-sectional view along line A-A' of the memory device as shown in FIG. 1A, in accordance with some embodiments of the present disclosure.

In some embodiments, the memory device 100 can include a cell region in which a memory device, such as the structure as shown in FIGS. 1A and 1B, is formed. The memory device can include, for example, a dynamic random access memory (DRAM) device, a one-time programming (OTP) memory device, a static random access memory (SRAM) device, or other suitable memory devices. In some embodiments, a DRAM can include, for example, a transistor, a capacitor, and other components.

During read operation, a word line can be asserted, turning on the transistor. The enabled transistor allows the voltage across the capacitor to be read by a sense amplifier through a bit line. During a write operation, the data to be written can be provided on the bit line when the word line is asserted.

In some embodiments, the memory device 100 can include a peripheral region (not shown) utilized to form a logic device (e.g., system-on-a-chip (SoC), central processing unit (CPU), graphics processing unit (GPU), application processor (AP), microcontroller, etc.), a radio frequency (RF) device, a sensor device, a micro-electro-mechanical-system (MEMS) device, a signal processing device (e.g., digital signal processing (DSP) device)), a front-end device (e.g., analog front-end (AFE) devices) or other device.

As shown in FIG. 1A, the memory device 100 may include a substrate 102, a plurality of metallization layers 116-1 and 116-2, a plurality of metallization layers 120-1 and 120-2, a plurality of gate dielectrics 104-1 and 104-2, a plurality of channel layers 106-1 and 106-2, as well as a dielectric layer 112.

The substrate 102 may be a semiconductor substrate, such as a bulk semiconductor, a semiconductor-on-insulator (SOI) substrate, or the like. The substrate 102 may include an elementary semiconductor including silicon or germanium in a single crystal form, a polycrystalline form, or an amorphous form, a compound semiconductor material including at least one of silicon carbide, gallium arsenide, gallium phosphide, indium phosphide, indium arsenide, and indium antimonide, an alloy semiconductor material including at least one of SiGe, GaAsP, AlInAs, AlGaAs, GaInAs, GaInP, and GaInAsP, any other suitable material, or a combination thereof. In some embodiments, the alloy semiconductor substrate may include a SiGe alloy with a gradient Ge feature in which the Si and Ge composition changes from one ratio at one location to another ratio with location of the feature. In another embodiment, the SiGe alloy is formed over a silicon substrate. In some embodiments, a SiGe alloy may be mechanically strained by another material in contact with the SiGe alloy. In some embodiments, the substrate 102 may have a multilayer structure, or the substrate 102 may include a multilayer compound semiconductor structure.

The substrate 102 may have multiple doped regions (not shown) therein. In some embodiments, p type and/or n type dopants may be doped in the substrate 102. In some embodiments, p type dopants include boron (B), other group III elements, or any combination thereof. In some embodiments, n type dopants include arsenic (As), phosphorus (P), other group V elements, or any combination thereof.

Each of the metallization layers 116-1 and 116-2 may extend along the Y-axis. Each of the metallization layers 116-1 and 116-2 may be parallel. In some embodiments, each of the metallization layers 116-1 and 116-2 may be physically separated. The metallization layers 116-1 and 116-2 may include conductive materials, such as tungsten (W), copper (Cu), aluminum (Al), tantalum (Ta), molybdenum (Mo), tantalum nitride (TaN), titanium, titanium nitride (TiN), the like, and/or a combination thereof. In some embodiments, the metallization layers 116-1 and 116-2 may be referred to as a word line.

The metallization layer 116-1 may include a sidewall 116s1 and a sidewall 116s2 opposite thereto. The sidewall 116s2 of the metallization layer 116-1 may face the metallization layer 116-2. In some embodiments, the metallization layer 116-1 may have a protruding portion 116-1p. In some embodiments, the protruding portion 116-1p of the metallization layer 116-1 may face the metallization layer 116-2. In some embodiments, the sidewall 116s2 of the metallization layer 116-1 may protrude toward the metallization layer 116-2, thereby defining the protruding portion 116-1p.

The metallization layer 116-2 may include a sidewall 116s3 and a sidewall 116s4 opposite to the sidewall 116s3. The sidewall 116s3 of the metallization layer 116-2 may face the metallization layer 116-1. In some embodiments, the metallization layer 116-2 may have a protruding portion 116-2p. In some embodiments, the protruding portion 116-2p of the metallization layer 116-2 may face metallization layer 116-1. In some embodiments, the sidewall 116s3 of the metallization layer 116-2 may protrude toward the metallization layer 116-1, thereby defining the protruding portion 116-2p.

In some embodiments, the protruding portion 116-1p of the metallization layer 116-1 and the protruding portion 116-2p of the metallization layer 116-2 may be staggered. In some embodiments, the protruding portion 116-1p of the metallization layer 116-1 is misaligned with the protruding portion 116-2p of the metallization layer 116-2 along the X-axis. In some embodiments, the protruding portion 116-1p of the metallization layer 116-1 may be free from overlapping the protruding portion 116-2p of the metallization layer 116-2 along the X-axis. In other embodiments, the protruding portion 116-1p of the metallization layer 116-1 may partially overlap with the protruding portion 116-2p of the metallization layer 116-2 along the X-axis. In some embodiments, the protruding portion 116-1p and/or 116-2p may have a half-circular or a half-elliptical profile from a top view. However, the present disclosure is not intended to be limiting.

The metallization layers 120-1 and 120-2 may be disposed over the metallization layers 116-1 and 116-2. Each of the metallization layers 120-1 and 120-2 may extend along the X-axis. Each of the metallization layers 120-1 and 120-2 may be parallel. Each of the metallization layers 120-1 and 120-2 may be physically separated. In some embodiments, the metallization layers 120-1 and 120-2 may be located at a horizontal level higher than that of the metallization layers 116-1 and 116-2. The metallization layers 120-1 and 120-2 may include conductive materials, such as tungsten, copper, aluminum, tantalum, tantalum nitride, titanium, titanium nitride, the like, and/or a combination thereof. In some embodiments, the metallization layers 120-1 and 120-2 may be referred to as a bit line.

In some embodiments, the gate dielectrics 104-1 and 104-2 may be disposed on a sidewall (not annotated in the figures) of the word line (e.g., 116-1 and 116-2). In some embodiments, the gate dielectric 104-1 may be embedded in the metallization layer 116-1. In some embodiments, the gate dielectric 104-2 may be embedded in the metallization layer 116-2. In some embodiments, the gate dielectric 104-1 may be surrounded by the metallization layer 116-1. In some embodiments, the gate dielectric 104-2 may be surrounded by the metallization layer 116-2. In some embodiments, each of the gate dielectrics 104-1 and 104-2 may overlap the metallization layer 120-1 or 120-2 along the Z-axis.

In some embodiments, the gate dielectrics 104-1 and 104-2 may include silicon oxide ($SiO_x$), silicon nitride ($Si_xN_y$), silicon oxynitride (SiON), or a combination thereof. In some embodiments, the gate dielectric layer may include dielectric material(s), such as high-k dielectric material. The high-k dielectric material may have a dielectric constant (k value) greater than 4. The high-k material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of this disclosure. In some embodiments, the gate dielectrics 104-1 and 104-2 may include a ring having a circular, oval, elliptical, or other profile.

In some embodiments, each of the channel layers 106-1 and 106-2 may be disposed on a sidewall (not annotated in the figures) of the gate dielectric 104-1 or 104-2. In some embodiments, each of the channel layers 106-1 and 106-2 may be embedded in the gate dielectric 104-1 or 104-2. In some embodiments, each of the channel layers 106-1 and 106-2 may be surrounded by the gate dielectric 104-1 or 104-2. In some embodiments, each of the channel layers 106-1 and 106-2 may be in contact with the gate dielectric 104-1 or 104-2. In some embodiments, each of the channel layers 106-1 and 106-2 may overlap the metallization layer 120-1 or 120-2 along the Z-axis. In some embodiments, each of the channel layers 106-1 and 106-2 may be completely surrounded by the gate dielectric 104-1 or 104-2 from a top view.

In some embodiments, each of the channel layers 106-1 and 106-2 may be disposed on a sidewall (not annotated in the figures) of the metallization layer 116-1 or 116-2. In some embodiments, each of the channel layers 106-1 and 106-2 may be embedded in the metallization layer 116-1 or 116-2. In some embodiments, each of the channel layers 106-1 and 106-2 may be surrounded by the metallization layer 116-1 or 116-2.

In some embodiments, the channel layers 106-1 and 106-2 may be staggered. In some embodiments, the channel layer 106-1 may be misaligned with the channel layer 106-2 along the X-axis. In some embodiments, the channel layer 106-1 may overlap the protruding portion 116-1p of the metallization layer 116-1 along the X-axis. In some embodiments, the channel layer 106-2 may overlap the protruding portion 116-2p of the metallization layer 116-2 along the X-axis.

The sidewall 116s1 of the metallization layer 116-1 and the channel layer 106-1 may have a distance D1 there between along the X-axis. The sidewall 116s2 of the metallization layer 116-1 and the channel layer 106-1 may have a distance D2 there between along the X-axis. In some embodiments, the distance D1 may be different from the distance D2. In some embodiments, the distance D2 may be greater than the distance D1.

The sidewall 116s3 of the metallization layer 116-2 and the channel layer 106-2 may have a distance D3 there between along the X-axis. The sidewall 116s4 of the metallization layer 116-2 and the channel layer 106-2 may have a distance D4 there between along the X-axis. In some embodiments, the distance D3 may be different from the distance D4. In some embodiments, the distance D3 may be greater than the distance D4.

In some embodiments, the sidewall 116s1 of the metallization layer 116-1 may have a relatively straight edge. In some embodiments, the sidewall 116s4 of the metallization layer 116-2 may have a relatively straight edge. The metallization layer 116-1s of the metallization layer 116-1 and the sidewall 116s4 of the metallization layer 116-2 may have a distance D5 there between along the X-axis. In some embodiments, the distance D5 may be substantially even or invariable along the Y-axis.

The metallization layer 116-2s of the metallization layer 116-1 and the sidewall 116s3 of the metallization layer 116-2 may have a distance D6 there between along the X-axis. In some embodiments, the distance D6 may vary along the Y-axis.

The material of the channel layers 106-1 and 106-2 may include an amorphous semiconductor, a poly-semiconductor and/or metal oxide. The semiconductor may include, but is not limited to, germanium (Ge), silicon (Si), tin (Sn), antimony (Sb). The metal oxide may include, but is not limited to, indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also represented as IGZO), an In—Al—Zn-based oxide, an In—S based oxide (also represented as ITO), an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In Hf—Al—Zn-based oxide, but the present disclosure is not limited in this regard.

In some embodiments, the dielectric layer 112 may be disposed on a sidewall (not annotated in the figures) of the metallization layer 116-1 or 116-2. In some embodiments, the dielectric layer 112 may be disposed between the metallization layers 116-1 and 116-2. In some embodiments, each of the gate dielectrics 104-1 and 104-2 may be physically spaced apart from the dielectric layer 112. In some embodiments, each of the gate dielectrics 104-1 and 104-2 may be physically spaced apart from the dielectric layer 112 by the metallization layer 116-1 or 116-2.

In some embodiments, each of the channel layer 106-1 or 106-2 may be physically spaced apart from the dielectric layer 112. In some embodiments, the channel layer 106-1 or 106-2 may be physically spaced apart from the dielectric layer 112 by the gate dielectrics 104-1 and 104-2 as well as by the metallization layer 116-1 or 116-2.

The dielectric layer 112 may include silicon oxide ($SiO_x$), silicon nitride ($Si_xN_y$), silicon oxynitride (SiON), or other suitable materials. In some embodiments, the material of the dielectric layer 112 may be different from that of the gate dielectrics 104-1 and 104-2. In some embodiments, the material of the dielectric layer 112 may be the same as that of the gate dielectrics 104-1 and 104-2 with different quality or film density.

FIG. 1B is a cross-sectional view along line A-A' of the memory device 100 as shown in FIG. 1A, in accordance with some embodiments of the present disclosure.

As shown in FIG. 1B, the memory device 100 may further include a plurality of capacitors 108-1 and 108-2, a dielectric layer 110, a dielectric layer 114, and contact plugs 118.

In some embodiments, the capacitor 108-1 may be electrically connected to the metallization layer 120-1 through the contact plug 118 and the channel layer 106-1. In some embodiments, the capacitor 108-2 may be electrically connected to the metallization layer 120-2 through the contact plug 118 and the channel layer 106-2.

In some embodiments, the capacitors 108-1 and 108-2 may be embedded in the substrate 102. In some embodiments, each of the capacitors 108-1 and 108-2 may include a first electrode, a capacitor dielectric, and a second electrode (not annotated in the figures). In some embodiments, each of the capacitors 108-1 and 108-2 may have a circular, oval, elliptical, or similar profile from a top view. In some embodiments, the capacitor dielectric may surround the first electrode. In some embodiments, the second electrode may surround the first electrode. In some embodiments, the second electrode may surround the capacitor dielectric. In some embodiments, the capacitor dielectric may be disposed between the first electrode and the second electrode.

The first electrode and/or second electrode may include a semiconductor material or a conductive material. The semiconductor material may include polysilicon or other suitable materials. The conductive material may include tungsten, copper, aluminum, tantalum, or other suitable materials.

The capacitor dielectric may include dielectric materials, such as silicon oxide, tungsten oxide, zirconium oxide, copper oxide, aluminum oxide, hafnium oxide, or the like.

In some embodiments, the contact plug 118 may be disposed between the capacitor 108-1 and the channel layer 106-1. The contact plug 118 may include a semiconductor material or a conductive material.

The dielectric layer 110 may be disposed on the substrate 102. The dielectric layer 110 may include silicon oxide ($SiO_x$), silicon nitride ($Si_xN_y$), silicon oxynitride (SiON), phosphosilicate glass (PSG), borophosphosilicate glass (BPSG), a low-k dielectric material (k<4), or other suitable materials. The dielectric layer 110 may also be referred to as a lower dielectric.

The dielectric layer 114 may be disposed on the metallization layers 116-1 and 116-2. The dielectric layer 114 may include silicon oxide ($SiO_x$), silicon nitride ($Si_xN_y$), silicon oxynitride (SiON), phosphosilicate glass (PSG), borophosphosilicate glass (BPSG), a low-k dielectric material (k<4), or other suitable materials. In some embodiments, the metallization layers 120-1 and 120-2 may be disposed on the dielectric layer 114. The dielectric layer 115 may also be referred to as an upper dielectric.

In some embodiments, each of the gate dielectrics 104-1 and 104-2 may penetrate the dielectric layer 114. In some embodiments, each of the gate dielectrics 104-1 and 104-2 may penetrate the dielectric layer 110. In some embodiments, each of the gate dielectrics 104-1 and 104-2 may penetrate the metallization 116-1 or 116-2.

In some embodiments, each of the channel layers 106-1 and 106-2 may penetrate the dielectric layer 114. In some embodiments, each of the channel layers 106-1 and 106-2 may penetrate the dielectric layer 110. In some embodiments, each of the channel layers 106-1 and 106-2 may penetrate the metallization 116-1 or 116-2.

In some embodiments, a word line (e.g., metallization layer 116-1 or 116-2), gate dielectric 104-1 or 104-2, and a channel layer 106-1 or 106-2 may be included in a transistor. During a read operation, a word line (e.g., metallization layer 116-1 or 116-2) may be asserted, turning on a transistor, which may be formed in a peripheral region. The enabled transistor allows the voltage across a capacitor (e.g., capacitor 108-1 or capacitor 108-2) to be read by a sense amplifier through a bit line (e.g., metallization layer 120-1 or 120-2). During a write operation, the data to be written may be provided on the bit line (e.g., metallization layer 120-1 or 120-2) when the word line (e.g., metallization layer 116-1 or 116-2) is asserted.

In this embodiment, the metallization layer 116-1 may have a protruding portion 116-1$p$, and the channel layer 106-1 may be partially surrounded by the protruding portion 116-1$p$. The protruding portion 116-1$p$ may allow a relatively great overlay error when patterning the metallization layer 116-1, which may prevent electrical leakage between the metallization layer 116-1 and the channel layer 106-1.

In this embodiment, the protruding portion 116-1$p$ of the metallization layer 116-1 may face the metallization layer 116-2, and the protruding portion 116-2$p$ of the metallization layer 116-2 may face the metallization layer 116-1, thereby reducing the size of the memory device 100.

Figure 2A:
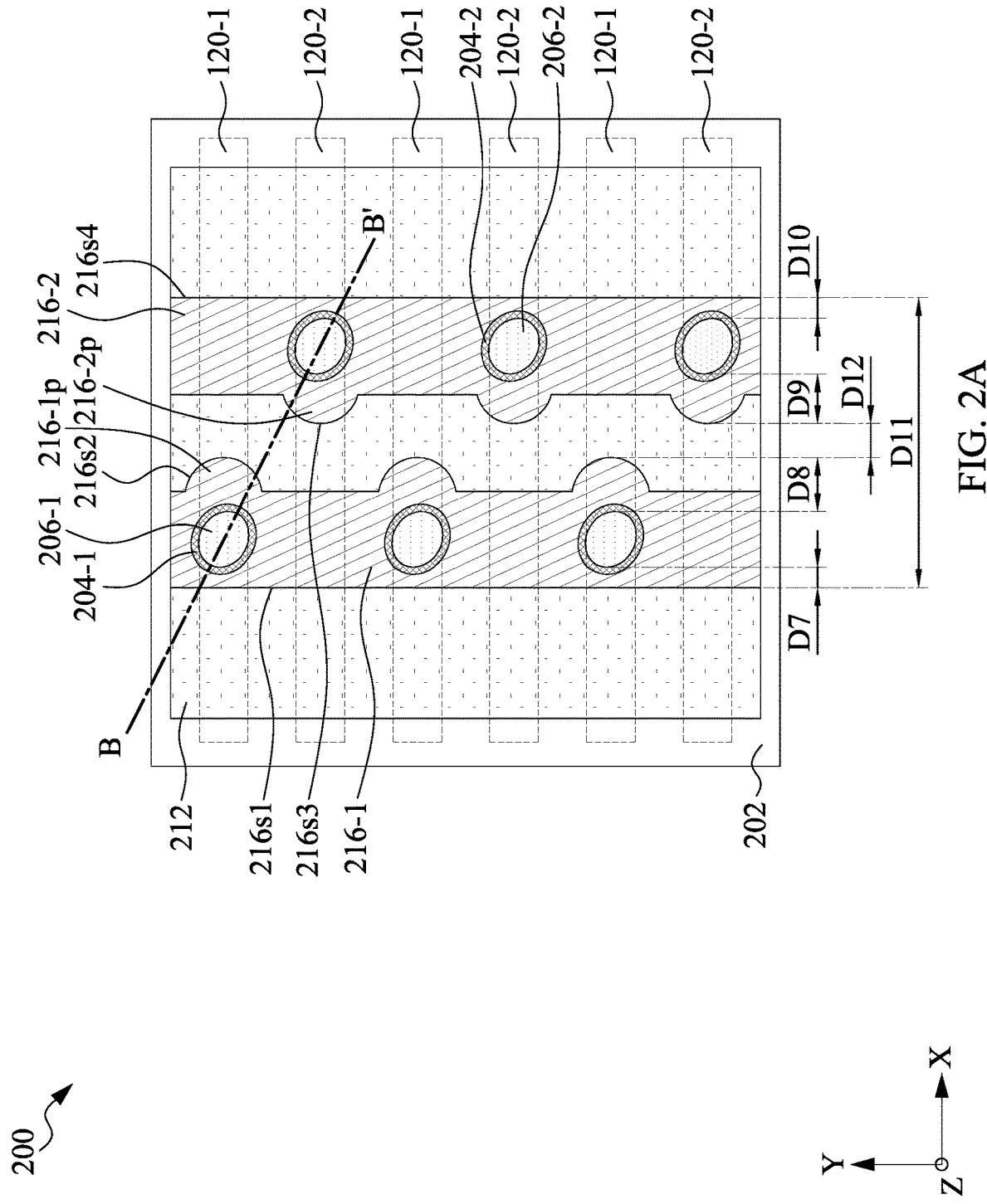
FIG. 2A is a top view of a memory device, in accordance with some embodiments of the present disclosure.
Figure 2B:
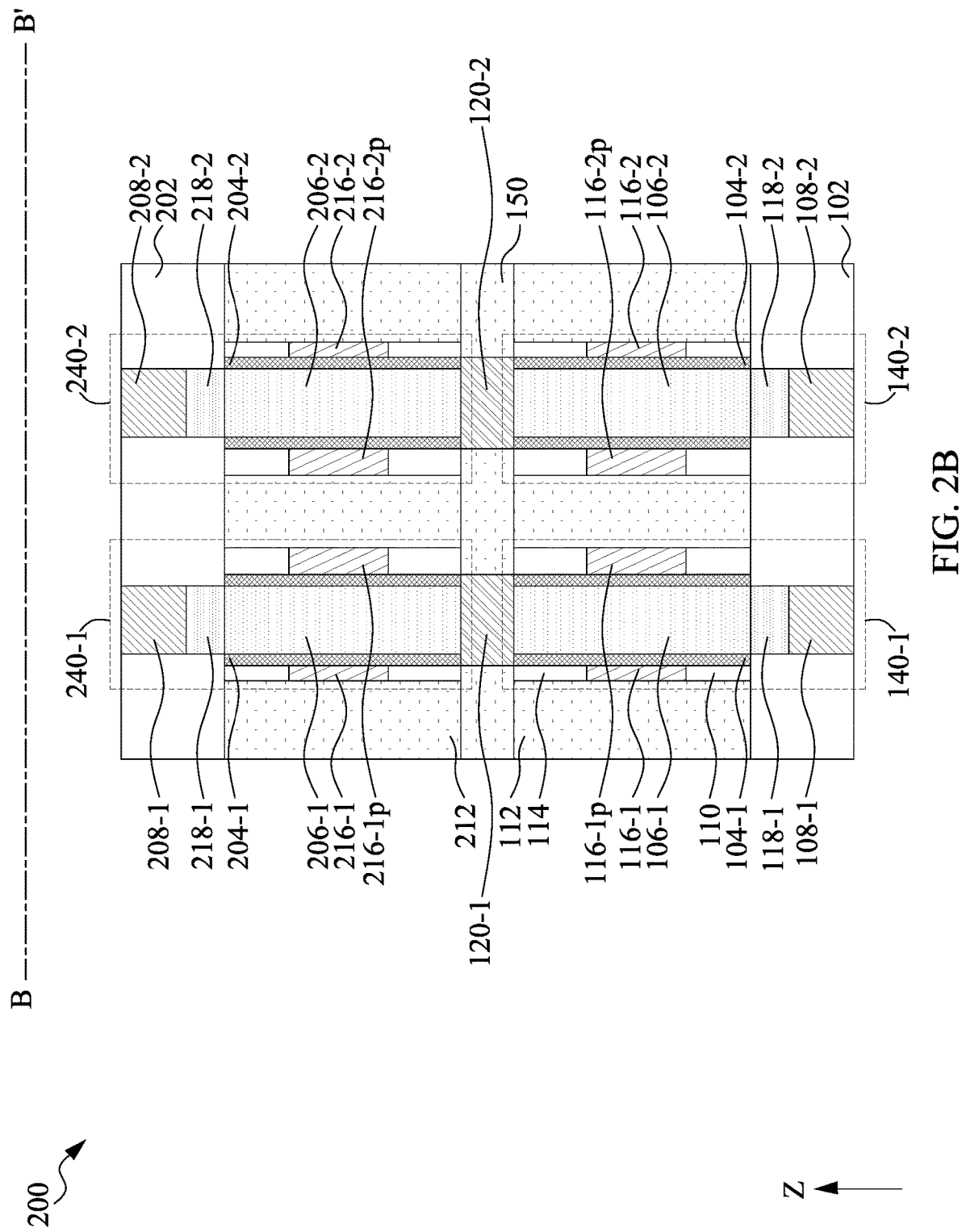
FIG. 2B is a cross-sectional view along line B-B' of the memory device as shown in FIG. 2A, in accordance with some embodiments of the present disclosure.

FIGS. 2A and 2B illustrate a memory device 200 in accordance with some embodiments of the present disclosure, wherein FIG. 2A is a top view, and FIG. 2B is a cross-sectional view along line B-B' of FIG. 2A. It should be noted that some elements or features are omitted from FIG. 2A for brevity. The memory device 200 is similar to the memory device 100 as shown in FIG. 1A and FIG. 1B, with differences there between as follows.

As shown in FIG. 2A, the memory device 200 may include a substrate 202, a plurality of metallization layers 216-1 and 216-2, a plurality of gate dielectrics 204-1 and 204-2, a plurality of channel layers 206-1 and 206-2, as well as a dielectric layer 212.

Each of the metallization layers 216-1 and 216-2 may extend along the Y-axis. Each of the metallization layers 216-1 and 216-2 may be parallel. In some embodiments, each of the metallization layers 216-1 and 216-2 may be physically separated. The material of the metallization layer 216-1 and the metallization layer 216-2 may be the same as or similar to that of the metallization layer 116-1. In some embodiments, the metallization layers 216-1 and 216-2 may be referred to as a top word line. In some embodiments, the metallization layers 116-1 and 116-2 (shown in FIG. 2B) may be referred to as a bottom word line.

In some embodiments, the material of the substrate 202 may be the same as or similar to that of the substrate 102. In some embodiments, the substrate 202 may also be referred to as a top substrate. In some embodiments, the substrate 102 (shown in FIG. 2B) may also be referred to as a bottom substrate.

The metallization layer 216-1 may include a sidewall 216$s$1 and a sidewall 216$s$2 opposite thereto. The sidewall 216$s$2 of the metallization layer 216-1 may face the metallization layer 216-2. In some embodiments, the metallization layer 216-1 may have a protruding portion 216-1$p$. In some embodiments, the protruding portion 216-1$p$ of the metallization layer 216-1 may face metallization layer 216-2. In some embodiments, the sidewall 216$s$2 of the metallization layer 216-1 may protrude toward the metallization layer 216-2, thereby defining the protruding portion 216-1$p$.

The metallization layer 216-2 may include a sidewall 216$s$3 and a sidewall 216$s$4 opposite thereto. The sidewall 216$s$3 of the metallization layer 216-2 may face the metallization layer 216-1. In some embodiments, the metallization layer 216-2 may have a protruding portion 216-2$p$. In some embodiments, the protruding portion 216-2$p$ of the metallization layer 216-2 may face metallization layer 216-1. In some embodiments, the sidewall 216$s$3 of the metallization layer 216-2 may protrude toward the metallization layer 216-1, thereby defining the protruding portion 216-2$p$.

In some embodiments, the protruding portion 216-1$p$ of the metallization layer 216-1 and the protruding portion 216-2$p$ of the metallization layer 216-2 may be staggered. In some embodiments, the protruding portion 216-1$p$ of the metallization layer 216-1 may be misaligned with the protruding portion 216-2$p$ of the metallization layer 216-2 along the X-axis. In some embodiments, the protruding portion 216-1$p$ of the metallization layer 216-1 may be free from overlapping the protruding portion 216-2$p$ of the metallization layer 216-2 along the X-axis. In other embodiments, the protruding portion 216-1$p$ of the metallization layer 216-1 may partially overlap with the protruding portion 216-2$p$ of the metallization layer 216-2 along the X-axis. In some embodiments, the protruding portion 216-1$p$ and/or 216-2$p$ may have a half-circular profile or a half-elliptical profile from a top view. However, the present disclosure is not intended to be limiting.

In some embodiments, the metallization layer 216-1 may be disposed on the metallization layer 120-1. In some embodiments, the metallization layer 216-2 may be disposed on the metallization layer 120-2. In some embodiments, each of metallization layers 216-1 and 216-2 may be located at a horizontal level higher than that of the metallization layers 120-1 and 120-2.

In some embodiments, the gate dielectrics 204-1 and 204-2 may be disposed on a sidewall (not annotated in the figures) of the word line. In some embodiments, the gate dielectric 204-1 may be embedded in the metallization layer 216-1. In some embodiments, the gate dielectric 204-2 may be embedded in the metallization layer 216-2. In some embodiments, the gate dielectric 204-1 may be surrounded by the metallization layer 216-1. In some embodiments, the gate dielectric 204-2 may be surrounded by the metallization layer 216-2. In some embodiments, each of the gate dielectrics 204-1 and 204-2 may overlap the metallization layer 120-1 or 120-2 along the Z-axis.

In some embodiments, the material of the gate dielectrics 204-1 and 204-2 may be the same as or similar to that of the gate dielectric 104-1. In some embodiments, the gate dielectrics 204-1 and 204-2 may be referred to as a top gate dielectric layer, and the gate dielectrics 104-1 and 104-2 (shown in FIG. 2B) may be referred to as a bottom gate dielectric layer.

In some embodiments, each of the channel layers 206-1 and 206-2 may be disposed on a sidewall (not annotated in the figures) of the gate dielectric 204-1 or 204-2. In some embodiments, each of the channel layers 206-1 and 206-2 may be embedded in the gate dielectric 204-1 or 204-2. In some embodiments, each of the channel layers 206-1 and 206-2 may be surrounded by the gate dielectric 204-1 or 204-2. In some embodiments, each of the channel layers 206-1 and 206-2 may be in contact with the gate dielectric 204-1 or 204-2.

In some embodiments, each of the channel layers 206-1 and 206-2 may be disposed on a sidewall (not annotated in the figures) of the metallization layer 216-1 or 216-2. In some embodiments, each of the channel layers 206-1 and 206-2 may be embedded in the metallization layer 216-1 or 216-2. In some embodiments, each of the channel layers 206-1 and 206-2 may be surrounded by the metallization layer 216-1 or 216-2.

In some embodiments, the material of the channel layers 206-1 and 206-2 may be the same as or similar to that of the channel layer 106-1. In some embodiments, the channel layers 206-1 and 206-2 may be referred to as a top channel layer, and the channel layers 106-1 and 106-2 (shown in FIG. 2B) may be referred to as a bottom channel layer.

In some embodiments, the channel layers 206-1 and 206-2 may be staggered. In some embodiments, the channel layer 206-1 may be misaligned with the channel layer 206-2 along the X-axis. In some embodiments, the channel layer 206-1 may be free from overlapping the channel layer 206-2 along the X-axis. In some embodiments, the channel layer 206-1 may overlap the protruding portion 216-1p along the X-axis. In some embodiments, the channel layer 206-2 may overlap the protruding portion 216-2p along the X-axis.

In some embodiments, each of the channel layers 206-1 and 206-2 may overlap the metallization layer 120-1 or 120-2 along the Z-axis. In some embodiments, each of the channel layers 206-1 and 206-2 may be completely surrounded by the gate dielectric 204-1 or 204-2 from a top view.

The sidewall 216s1 of the metallization layer 216-1 and the channel layer 206-1 may have a distance D7 there between along the X-axis. The sidewall 216s2 of the metallization layer 216-1 and the channel layer 206-1 may have a distance D8 there between along the X-axis. In some embodiments, the distance D7 may be different from the distance D8. In some embodiments, the distance D8 may be greater than the distance D7.

The sidewall 216s3 of the metallization layer 216-2 and the channel layer 206-2 may have a distance D9 there between along the X-axis. The sidewall 216s4 of the metallization layer 216-2 and the channel layer 206-2 may have a distance D10 there between along the X-axis. In some embodiments, the distance D9 may be different from the distance D10. In some embodiments, the distance D9 may be greater than the distance D10.

In some embodiments, the sidewall 216s1 of the metallization layer 216-1 may have a relatively straight edge. In some embodiments, the sidewall 216s4 of the metallization layer 216-2 may have a relatively straight edge. The metallization layer 216-1s of the metallization layer 216-1 and the sidewall 216s4 of the metallization layer 216-2 may have a distance D11 there between along the X-axis. In some embodiments, the distance D11 may be substantially even or invariable along the Y-axis.

The metallization layer 216-2s of the metallization layer 216-1 and the sidewall 216s3 of the metallization layer 216-2 may have a distance D12 there between along the X-axis. In some embodiments, the distance D12 may vary along the Y-axis.

In some embodiments, the dielectric layer 212 may be disposed on the sidewall of the metallization layer 216-1 or 216-2. In some embodiments, the dielectric layer 212 may be disposed between the metallization layers 216-1 and 216-2. In some embodiments, each of the gate dielectrics 204-1 and 204-2 may be physically spaced apart from the dielectric layer 212. In some embodiments, each of the gate dielectrics 204-1 and 204-2 may be physically spaced apart from the dielectric layer 212 by the metallization layer 216-1 or 216-2. In some embodiments, the material of the dielectric layer 212 may be the same as or similar to that of the dielectric layer 112.

In some embodiments, each of the channel layer 206-1 or 206-2 may be physically spaced apart from the dielectric layer 212. In some embodiments, the channel layer 206-1 or 206-2 may be physically spaced apart from the dielectric layer 212 by the gate dielectrics 204-1 and 204-2 as well as by the metallization layer 216-1 or 216-2.

As shown in FIG. 2B, the memory device 200 may include cells 140-1, 140-2, 240-1, and 240-2. Each of the cells 240-1 and 240-2 may be located at a horizontal level higher than that of the cells 140-1 and 140-2. In some embodiments, each of the cells 140-1 and the 140-2 may also be referred to as a bottom cell. In some embodiments, each of the cells 240-1 and 240-2 may also be referred to as a top cell.

The cell 140-1 may include the capacitor 108-1, channel layer 106-1, metallization layer 116-1, contact plug 118-1, and metallization layer 120-1.

The cell 140-2 may include the capacitor 108-2, channel layer 106-2, metallization layer 116-2, contact plug 118-2, and metallization layer 120-2.

The cell 240-1 may include a capacitor 208-1, channel layer 206-1, metallization layer 216-1, contact plug 218-1 and metallization layer 120-1.

The cell 240-2 may include a capacitor 208-2, channel layer 206-2, metallization layer 216-2, contact plug 218-2, and metallization layer 120-2.

In some embodiments, the protruding portion 216-1p of the metallization layer 216-1 may partially or completely overlap the protruding portion 116-1p of the metallization layer 116-1 along the Z-axis. In some embodiments, the protruding portion 216-2p of the metallization layer 216-2 may partially or completely overlap the protruding portion 116-2p of the metallization layer 116-2 along the Z-axis.

In some embodiments, the metallization layers 120-1 and 120-2 may be disposed within a dielectric layer 150. In some embodiments, the metallization layer 120-1 may be disposed between the cells 140-1 and 240-1. In some embodiments, the metallization layer 120-1 may be disposed between the channel layers 106-1 and 206-1.

In some embodiments, the metallization layer 120-1 may be disposed between the channel layers 106-1 and 206-1. In some embodiments, the metallization layer 120-1 may be disposed between the metallization layers 116-1 and 216-1. In some embodiments, the metallization layer 120-1 may be disposed between the capacitors 108-1 and 208-1. In some embodiments, the metallization layer 120-1 may be disposed between the channel layer 106-1 and capacitor 208-1. In some embodiments, the metallization layer 120-1 may function as a common bit line of the cells 140-1 and the 240-1. In some embodiments, the metallization layer 120-2 may function as a common bit line of the cells 140-2 and the 240-2.

In this embodiment, the metallization layer 120-1 may function as a common bit line. Therefore, the size of the memory device 200 may be reduced. Further, the capacitance of the memory device 200 may be increased.

Figure 3:
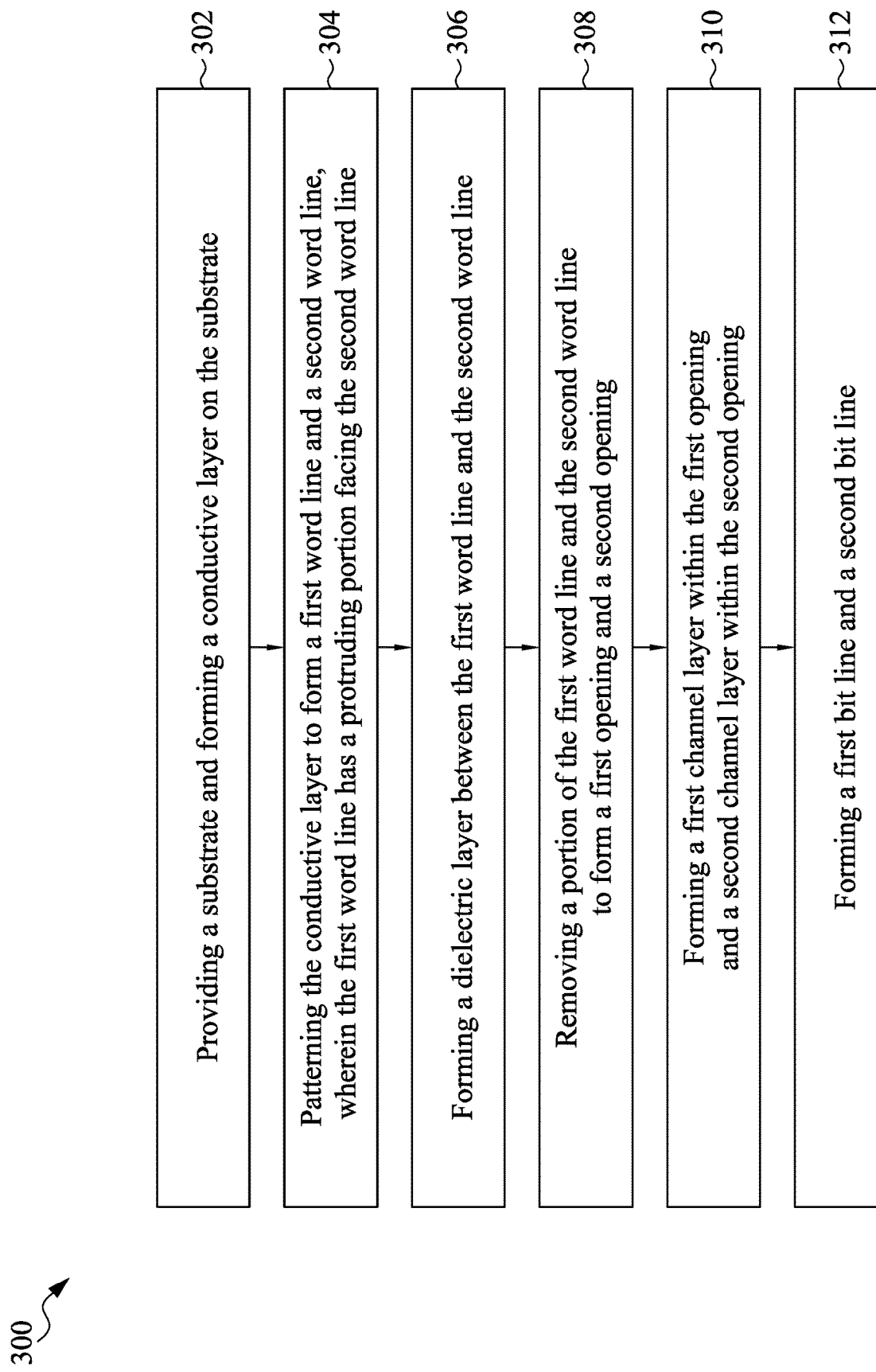
FIG. 3 is a flowchart illustrating a method of manufacturing a memory device, in accordance with some embodiments of the present disclosure.

FIG. 3 is a flowchart illustrating a method 300 of manufacturing a memory device, in accordance with some embodiments of the present disclosure.

The method 300 begins with operation 302, in which a substrate may be provided. In some embodiments, a first capacitor and a second capacitor may be formed within the substrate. In some embodiments, contact plugs may be formed within the substrate and over the first capacitor and the second capacitor. In some embodiments, a first dielectric layer may be formed on the substrate. In some embodiments, a conductive layer may be formed on the first dielectric layer. In some embodiments, a second dielectric layer may be formed on the conductive layer.

The method 300 continues with operation 304 in which a patterning process may be performed to remove a portion of the first dielectric layer, the second dielectric layer, and the conductive layer. As a result, a first word line and a second word line are formed. A plurality of openings may be formed to expose an upper surface of the substrate.

In some embodiments, the conductive layer may be patterned to form a first protruding portion of the first word line. In some embodiments, the conductive layer may be patterned to form a second protruding portion of the second word line. In some embodiments, the first protruding portion may face the second word line. In some embodiments, the second protruding portion may face the first word line.

The method 300 continues with operation 306 in which a third dielectric layer may be formed to fill the openings.

The method 300 continues with operation 308 in which a portion of the second dielectric layer, the first word line and the second word line, and the first dielectric layer may be removed. An opening in the first word line may be formed. An opening in the second word line may be formed.

The method 300 continues with operation 310 in which a first gate dielectric and a first channel layer may be formed within the opening of the first word line. A second gate dielectric and a second channel layer may be formed within the opening of the second word line.

The method 300 continues with operation 312 in which a first bit line and a second bit line may be formed on the first channel layer and the second channel layer, respectively, thereby forming a memory device.

The method 300 is merely an example, and is not intended to limit the present disclosure beyond what is explicitly recited in the claims. Additional operations can be provided before, during, or after each operation of the method 300, and some operations described can be replaced, eliminated, or reordered for additional embodiments of the method. In some embodiments, the method 300 can include further operations not depicted in FIG. 3. In some embodiments, the method 300 can include one or more operations depicted in FIG. 3.

FIG. 4A to FIG. 9A and FIG. 4B to FIG. 9B illustrate one or more stages of an exemplary method for manufacturing a memory device according to some embodiments of the present disclosure, wherein FIG. 4A to FIG. 9A are top views, and FIG. 4B to FIG. 9B are cross-sectional views along line A-A' of FIG. 4A to FIG. 9A, respectively. It should be noted that, for brevity, some elements are illustrated in cross-sectional views but not in top views.

Figure 4A:
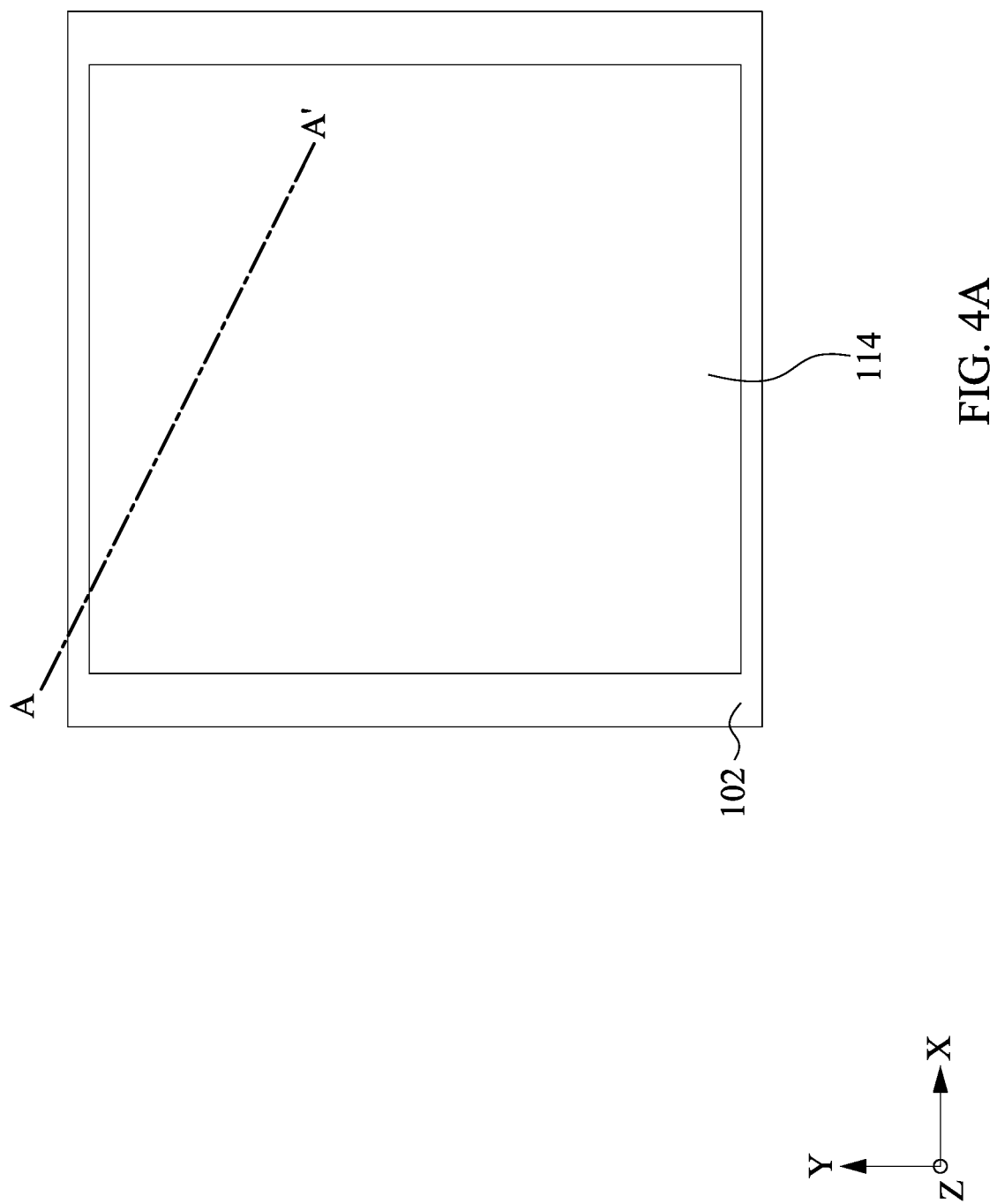
FIG. 4A illustrates one or more stages of an exemplary method for manufacturing a memory device according to some embodiments of the present disclosure.
Figure 4B:
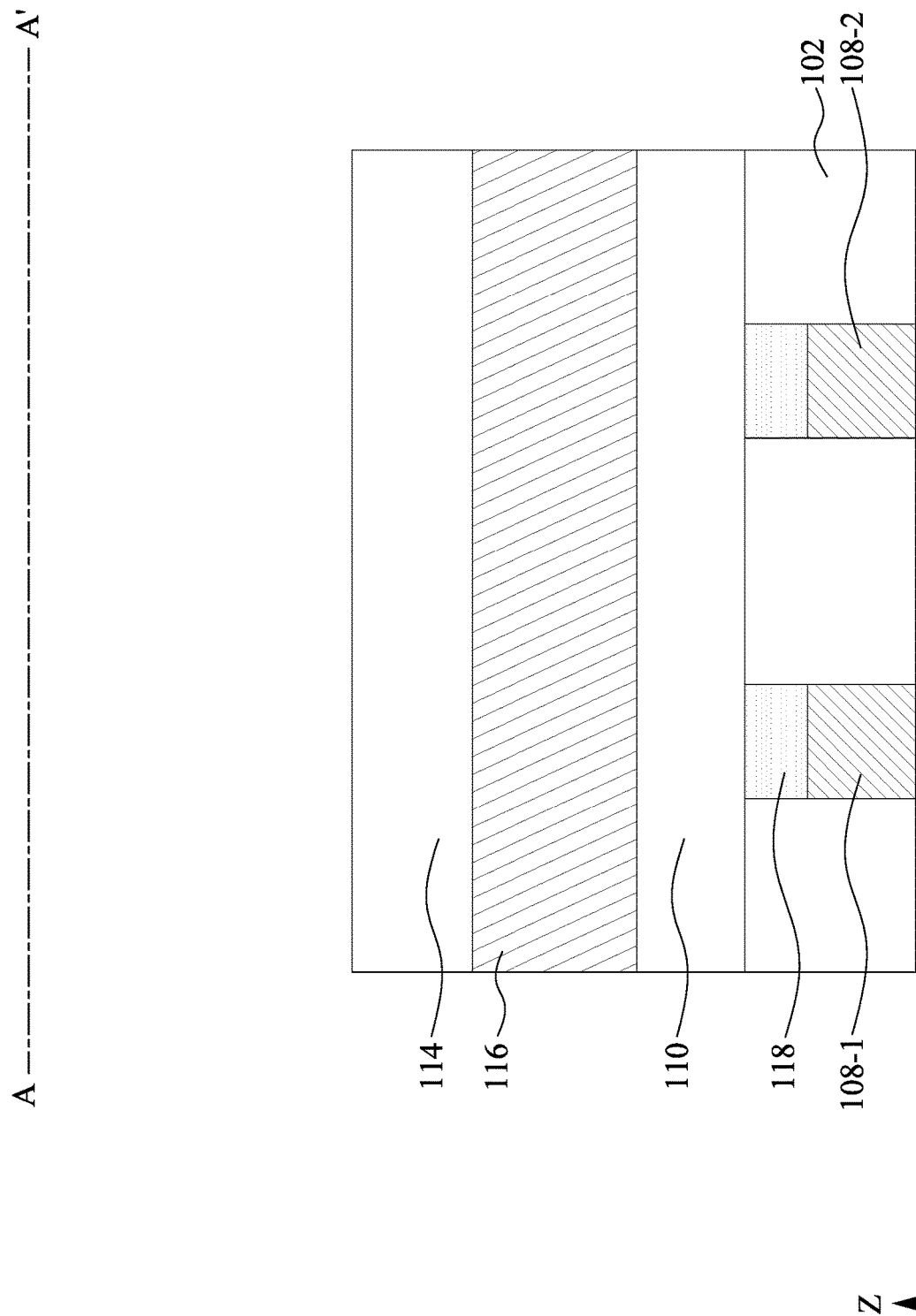
FIG. 4B is a cross-sectional view along line A-A' of FIG. 4A according to some embodiments of the present disclosure.

As shown in FIG. 4A and FIG. 4B, a substrate 102 may be provided. In some embodiments, capacitors 108-1 and 108-2 may be formed within the substrate 102. In some embodiments, contact plugs 118 may be formed within the substrate 102 and over the capacitors 108-1 and 108-2. In some embodiments, a dielectric layer 110 may be formed on the substrate 102. In some embodiments, a conductive layer 116 may be formed on the dielectric layer 110. In some embodiments, a dielectric layer 114 may be formed on the conductive layer 116. The dielectric layer 110 and dielectric layer 114 may be formed by chemical vapor deposition (CVD), atomic layer deposition (ALD), physical vapor deposition (PVD), low-pressure chemical vapor deposition (LPCVD), or other suitable processes. The conductive layer 116 may be formed by sputtering, PVD, or other suitable processes.

Figure 5A:
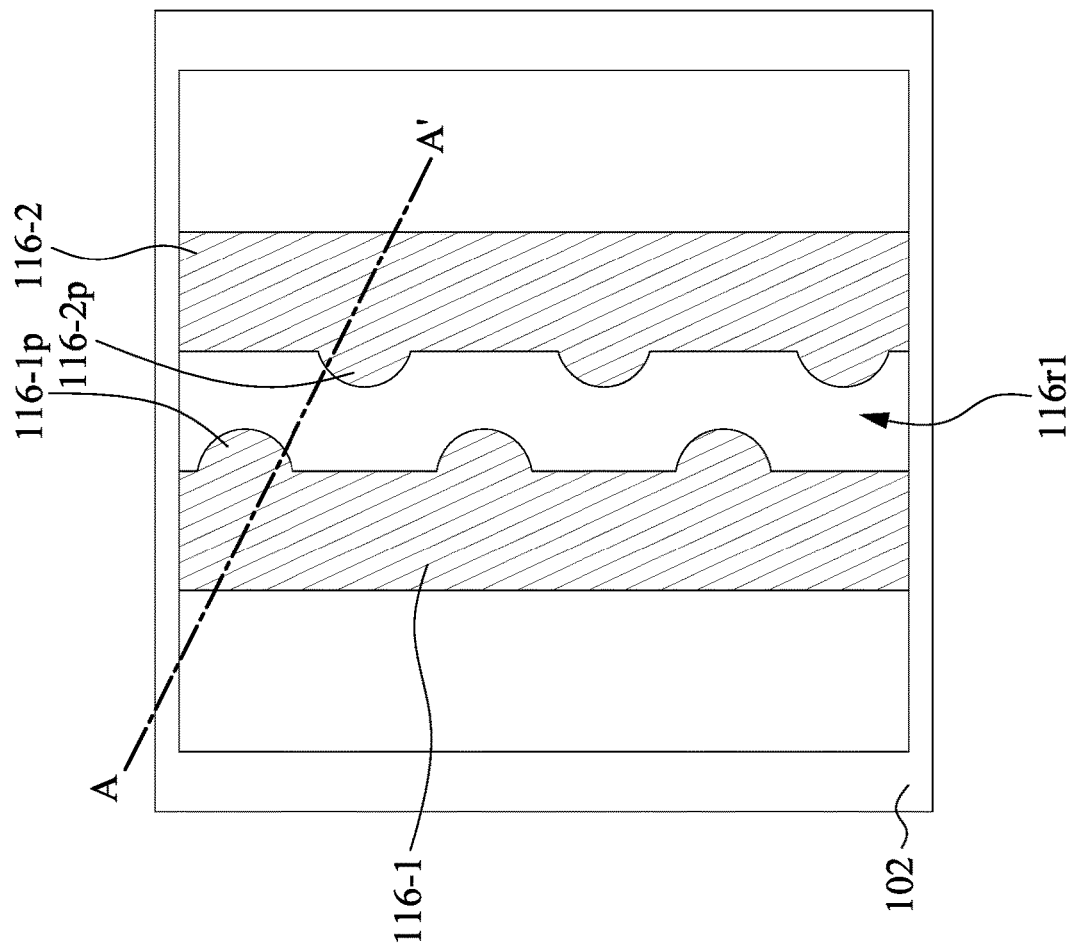
FIG. 5A illustrates one or more stages of an exemplary method for manufacturing a memory device according to some embodiments of the present disclosure.
Figure 5B:
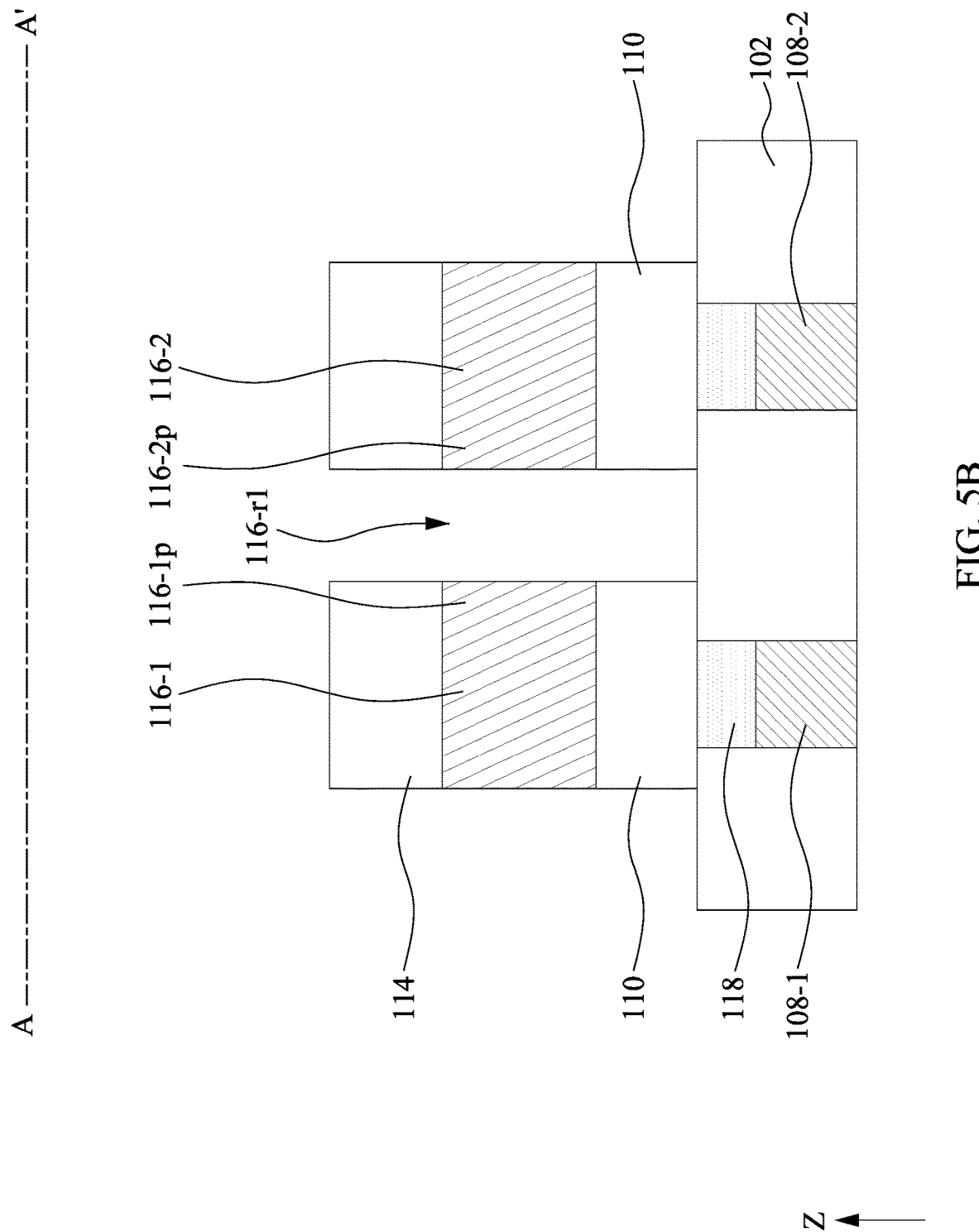
FIG. 5B is a cross-sectional view along line A-A' of FIG. 5A according to some embodiments of the present disclosure.

As shown in FIG. 5A and FIG. 5B, a patterning process may be performed to remove a portion of the dielectric layer 110, dielectric layer 114, and conductive layer 116. As a result, metallization layers 116-1 and 116-2 are formed. A plurality of openings 116r1 may be formed to expose an upper surface of the substrate 102. The patterning process may include lithography, etching, or other suitable processes. The photolithography process may include photoresist coating (e.g., spin-on coating), soft baking, mask aligning, exposure, post-exposure baking, developing the photoresist, rinsing and drying (e.g., hard baking). The etching process may include, for example, dry or wet etching.

In some embodiments, the conductive layer 116 may be patterned to form a protruding portion 116-1$p$ of the metallization layer 116-1. In some embodiments, the conductive layer 116 may be patterned to form a protruding portion 116-2$p$ of the metallization layer 116-2. In some embodiments, the protruding portion 116-1$p$ may face the metallization layer 116-2. In some embodiments, the protruding portion 116-2$p$ may face the metallization layer 116-1.

Figure 6A:
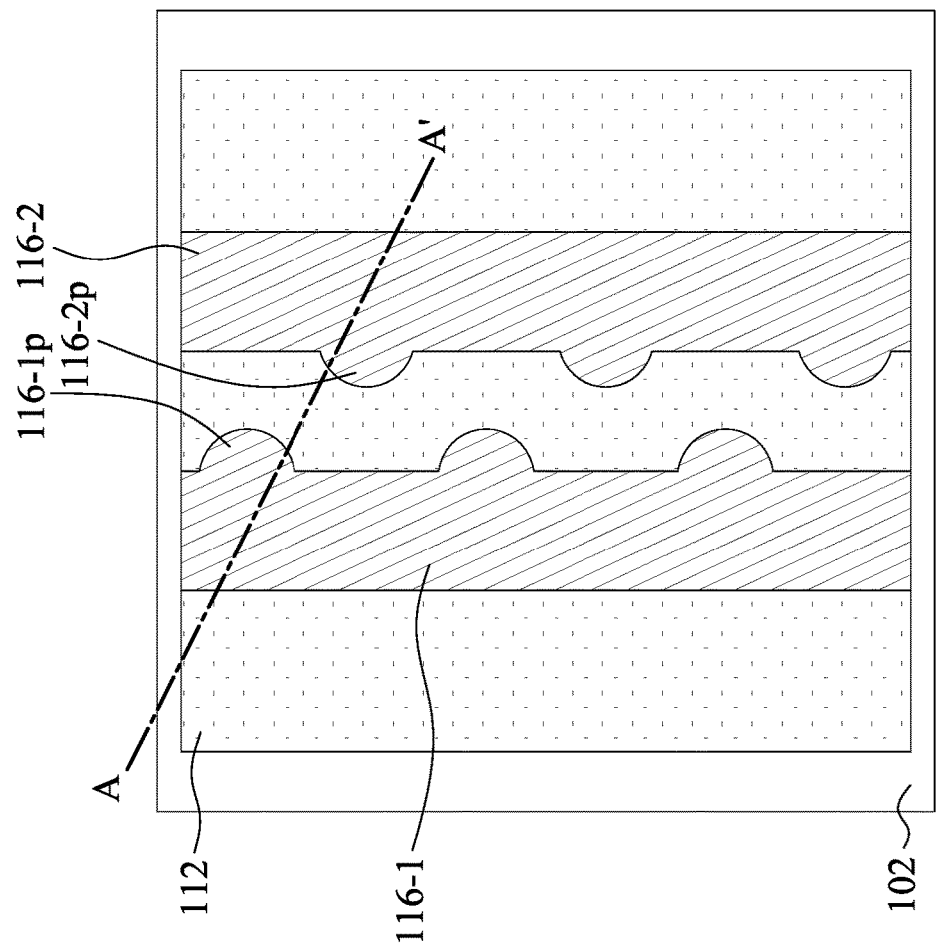
FIG. 6A illustrates one or more stages of an exemplary method for manufacturing a memory device according to some embodiments of the present disclosure.
Figure 6B:
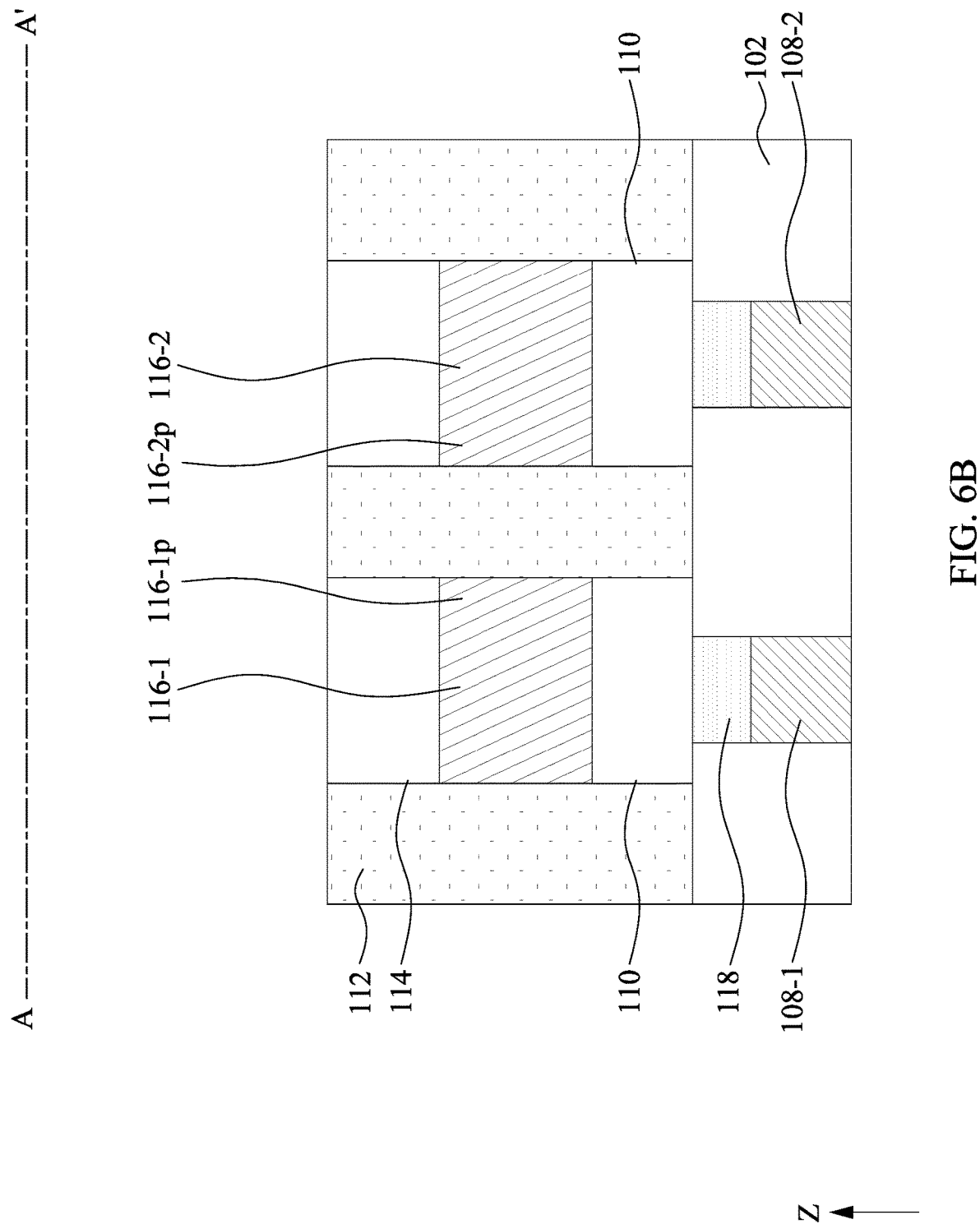
FIG. 6B is a cross-sectional view along line A-A' of FIG. 6A according to some embodiments of the present disclosure.

As shown in FIG. 6A and FIG. 6B, a dielectric layer 112 may be formed to fill the openings 116r1. The dielectric layer 112 may be formed by CVD, ALD, PVD, LPCVD, or other suitable processes.

Figure 7A:
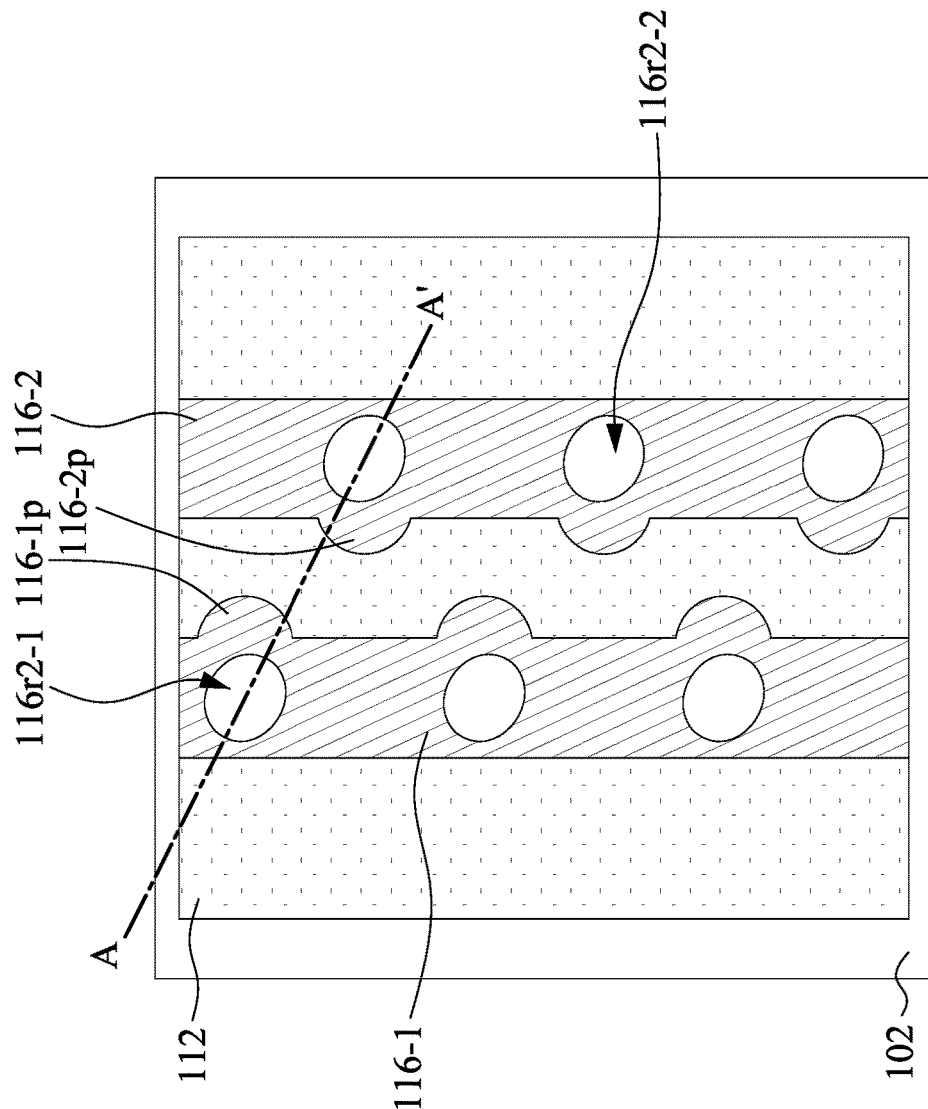
FIG. 7A illustrates one or more stages of an exemplary method for manufacturing a memory device according to some embodiments of the present disclosure.
Figure 7B:
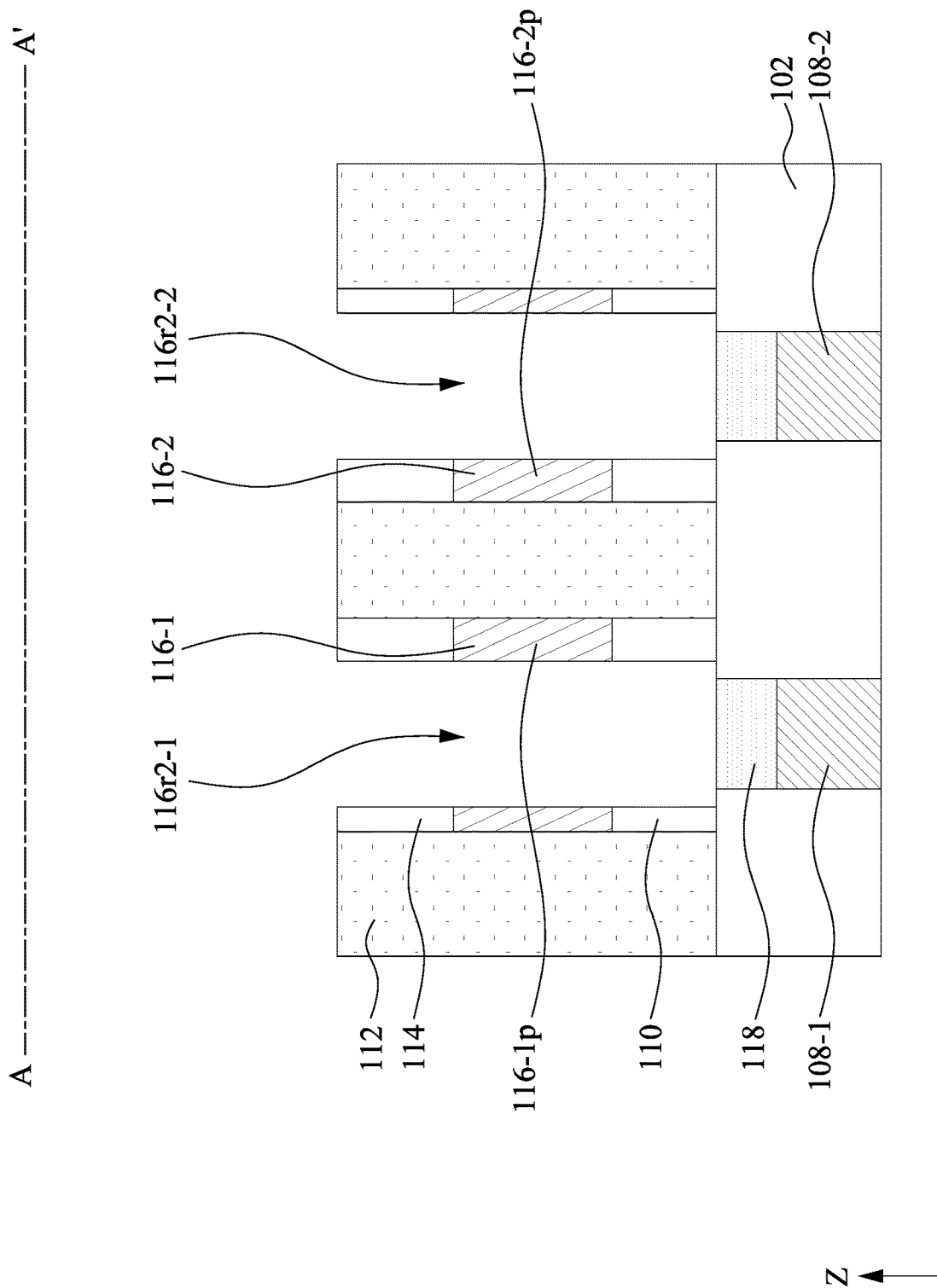
FIG. 7B is a cross-sectional view along line A-A' of FIG. 7A according to some embodiments of the present disclosure.

As shown in FIG. 7A and FIG. 7B, a portion of the dielectric layer 114, the metallization layers 116-1 and 116-2, and the dielectric layer 110 may be removed. An opening 116r2-1 of the metallization layer 116-1 may be formed. An opening 116r2-2 of the metallization layer 116-2 may be formed. In some embodiments, the openings 116r2-1 and 116r2-2 may be staggered. In some embodiments, the openings 116r2-1 may be free from overlapping the opening 116r2-2 along the X-axis. In other embodiments, the openings 116r2-1 may partially overlap the opening 116r2-2 along the X-axis.

Figure 8A:
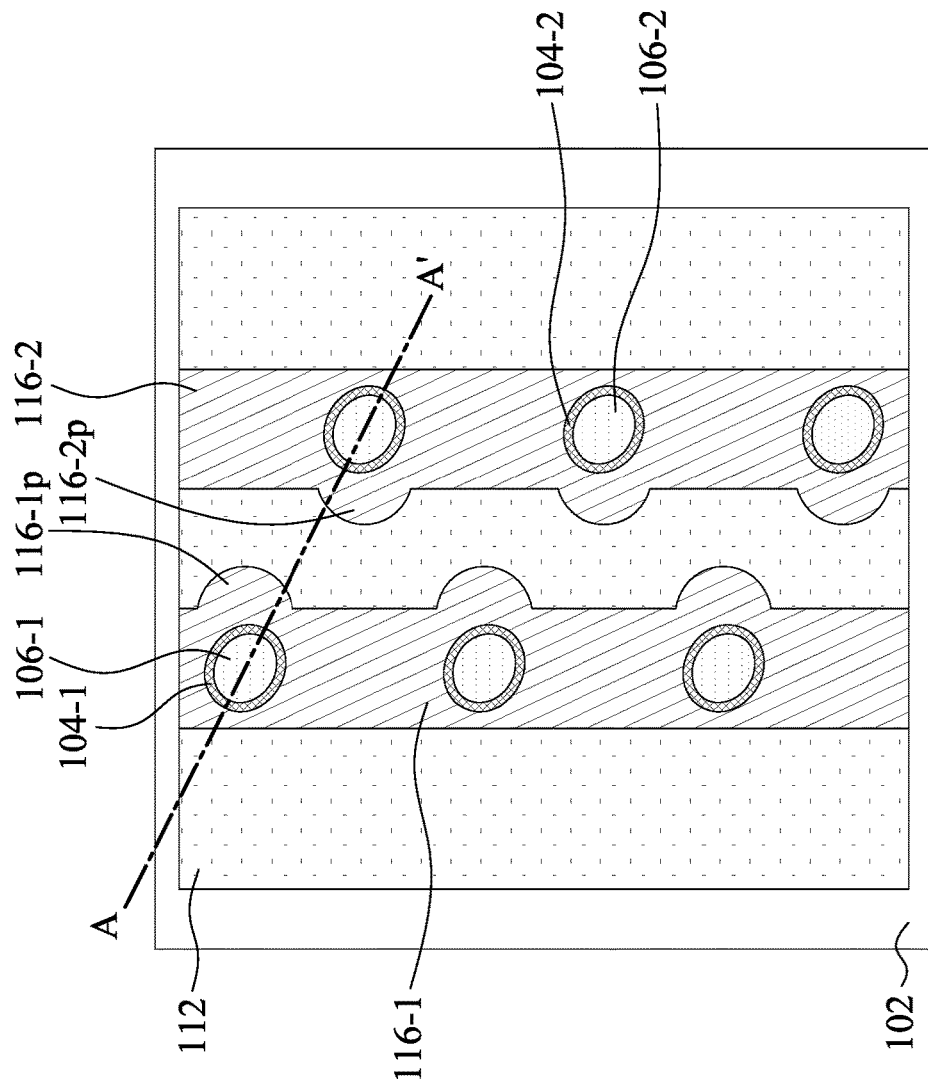
FIG. 8A illustrates one or more stages of an exemplary method for manufacturing a memory device according to some embodiments of the present disclosure.
Figure 8B:
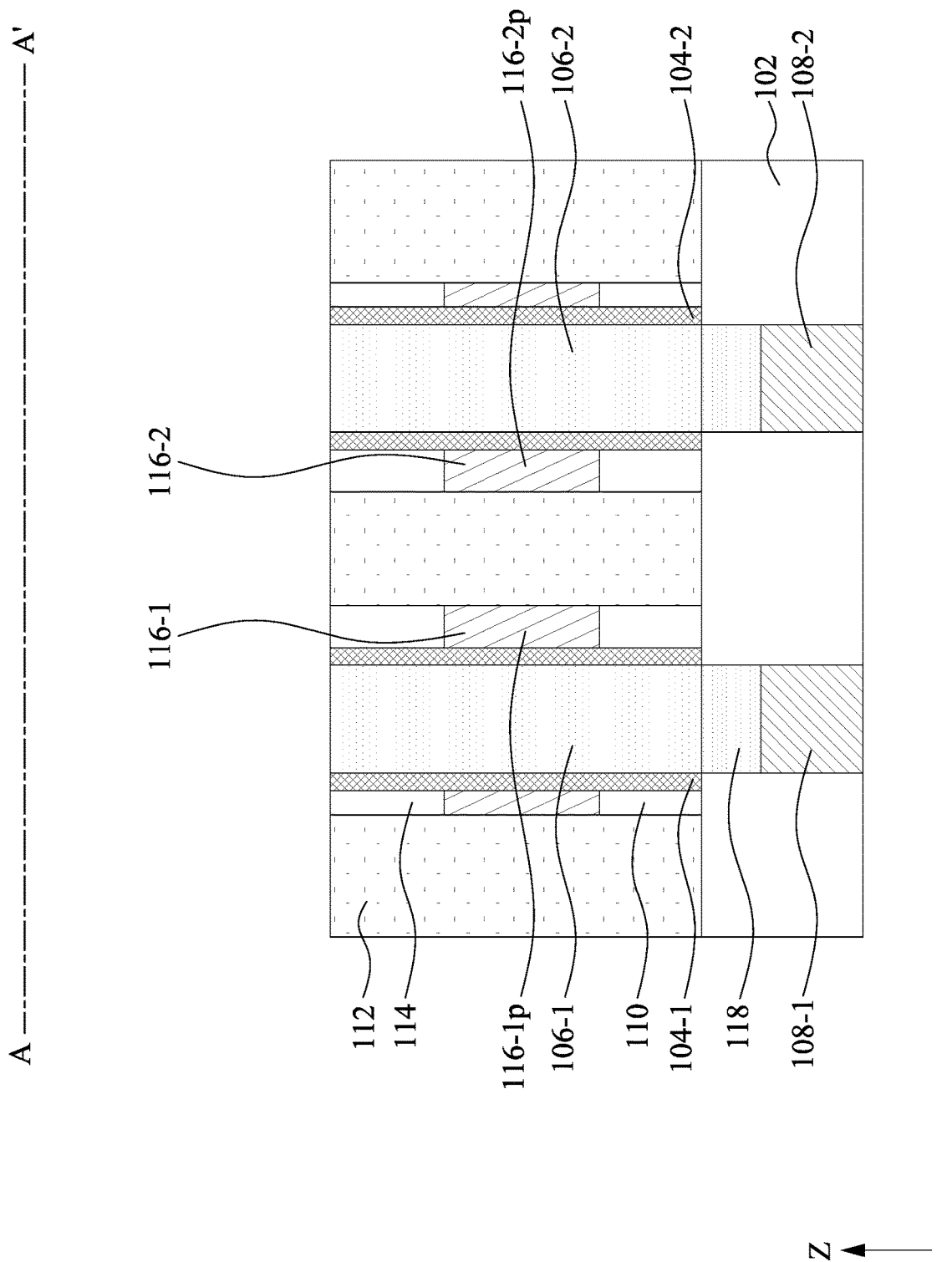
FIG. 8B is a cross-sectional view along line A-A' of FIG. 8A according to some embodiments of the present disclosure.

As shown in FIG. 8A and FIG. 8B, a gate dielectric 104-1 and a channel layer 106-1 may be formed within the opening 116r2-1. A gate dielectric 104-2 and a channel layer 106-2 may be formed within the opening 116r2-2. The gate dielectrics 104-1 and 104-2 as well as the channel layers 106-1 and 106-2 may be formed by CVD, ALD, PVD, LPCVD, or other suitable processes.

Figure 9A:
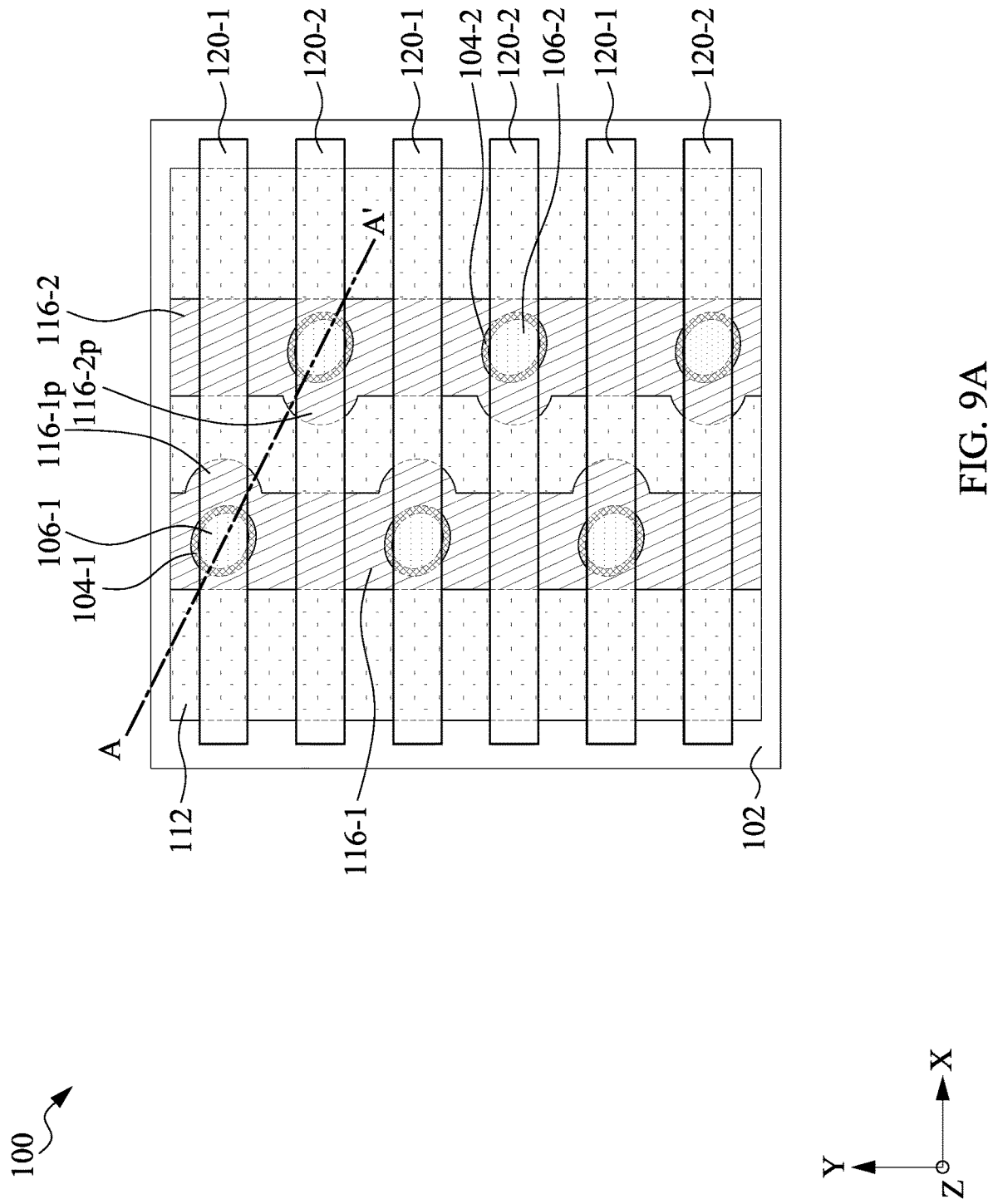
FIG. 9A illustrates one or more stages of an exemplary method for manufacturing a memory device according to some embodiments of the present disclosure.
Figure 9B:
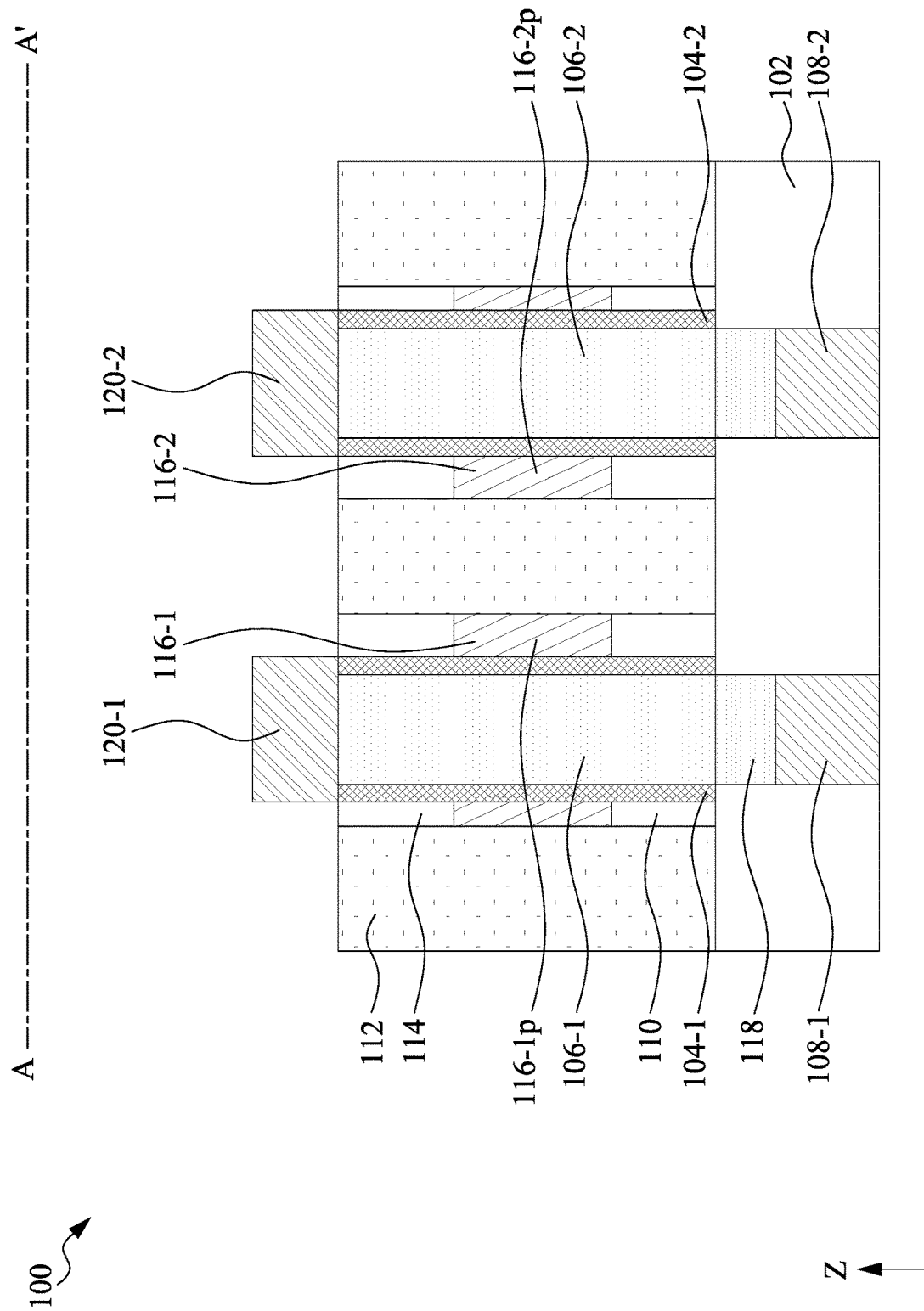
FIG. 9B is a cross-sectional view along line A-A' of FIG. 9A according to some embodiments of the present disclosure.

As shown in FIG. 9A and FIG. 9B, metallization layers 120-1 and 120-2 may be formed on the dielectric layer 112, thereby forming the memory device 100. The metallization layers 120-1 and 120-2 may be formed by sputtering, PVD, or other suitable processes.

In this embodiment, the word line (e.g., 116-1 and/or 116-2) has a protruding portion (e.g., 116-1$p$ and 116-2$p$). The protruding portion may allow a relatively great overlay error when patterning the word line to form an opening (e.g., 116r2-1 and/or 116r2-2) within which a channel layer (e.g., 106-1 and/or 106-2) is formed. Therefore, electrical leakage between the word line and the channel layer may be prevented.

One aspect of the present disclosure provides a memory device. The memory device includes a substrate, a dielectric layer, a first metallization layer, first channel layer, a second metallization layer, and a second channel layer. The dielectric layer is disposed on the substrate. The first metallization layer is disposed within the dielectric layer and extends along a first direction. The first channel layer is surrounded by the first metallization layer. The second metallization layer is disposed within the dielectric layer and extends along the first direction. The second channel layer is surrounded by the second metallization layer. The first metallization layer includes a first protruding portion protruding toward the second metallization layer.

Another aspect of the present disclosure provides another memory device. The memory device includes a bottom substrate, a first bottom cell, a top substrate, a first top cell, and a common bit line. The first bottom cell includes a first bottom capacitor disposed within the bottom substrate. The first bottom cell also includes a first bottom word line disposed on the bottom substrate and extending along a first direction. The first bottom cell further includes a first bottom channel layer surrounded by the first bottom word line. The first top cell includes a first top capacitor disposed within the top substrate. The first top cell also includes a first top word line disposed on the top substrate and extending along the first direction. The first top cell further includes a first top channel layer surrounded by the first top word line. The common bit line is disposed between the first bottom cell and the first top cell and extends along a second direction substantially perpendicular to the first direction.

Another aspect of the present disclosure provides a method for manufacturing a memory device. The method includes providing a substrate. The method also includes forming a conductive layer on the substrate. The method further includes patterning the conductive layer to form a first metallization layer and a second metallization layer extending along a first direction. The first metallization layer has a first protruding portion protruding toward the second metallization layer. In addition, the method includes forming a first channel layer within the first metallization layer and a second channel layer within the second metallization layer.

The embodiments of the present disclosure provide a memory device. The memory device may include a word line with a protruding portion. The protruding portion may allow a relatively great overlay error of patterning the word line to form an opening within which a channel layer is formed, which may prevent electrical leakage between the word line and the channel layer.

Although the present disclosure and its advantages have been described in detail, it should be understood that various changes, substitutions and alterations may be made herein without departing from the spirit and scope of the disclosure as defined by the appended claims. For example, many of the processes discussed above may be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A method for preparing a memory device, comprising:
    forming a first bottom cell within a bottom substrate, comprising: forming a first bottom capacitor within the bottom substrate; forming a first bottom word line on the bottom substrate and extending along a first direction; and forming a first bottom channel layer surrounded by the first bottom word line;
    forming a first top cell within a top substrate, comprising: forming a first top capacitor within the top substrate; forming a first top word line on the top substrate and extending along the first direction; and forming a first top channel layer surrounded by the first top word line;
    forming a common bit line between the first bottom cell and the first top cell and extending along a second direction substantially perpendicular to the first direction, wherein the first bottom channel layer and the first top channel layer are separated from each other by the common bit line between the first bottom cell and the first top cell.

2. The method of claim 1, wherein the first top word line is formed between the first top capacitor and the common bit line.

3. The method of claim 1, wherein the first top word line is formed between the first top capacitor and the first bottom word line.

4. The method of claim 1, wherein forming the first top word line comprises forming a protruding portion protruding toward a second top word line.

5. The method of claim 4, further comprising:
    forming a second bottom cell, comprising:
    forming a second bottom word line on the bottom substrate and extending along the first direction; and
    forming a second bottom channel layer surrounded by the second bottom word line,
    wherein the first bottom word line comprises a protruding portion protruding toward the second bottom word line.

6. The method of claim 5, wherein the second bottom word line comprises a protruding portion protruding toward the first bottom word line.

7. The method of claim 6, wherein the protruding portion of the first bottom word line is misaligned with the protruding portion of the second bottom word line along the second direction.

8. The method of claim 5, wherein the first bottom channel layer is misaligned with the second bottom channel layer along the second direction.

9. The method of claim 5, wherein the protruding portion of the first bottom word line overlaps the protruding portion of the first top word line along a third direction substantially perpendicular to the first direction and the second direction.

10. The method of claim 5, wherein the first top channel layer overlaps the protruding portion of the first top word line along the second direction.

11. The method of claim 5, further comprising:
    forming a second top cell, comprising:
    forming a second top word line on the top substrate and extending along the first direction; and
    forming a second top channel layer surrounded by the second top word line,
    wherein the second top word line comprises a protruding portion protruding toward the first top word line.

12. The method of claim 11, wherein the first top word line has a first sidewall and a second sidewall opposite to the first sidewall, the second sidewall faces the second top word line, and a first distance between the first sidewall and the first top channel layer is different from a second distance between the second sidewall and the first top channel layer.

13. The method of claim 12, wherein the second top word line has a third sidewall and a fourth sidewall, the third sidewall faces the first top word line, and a third distance between the third sidewall and the second top channel layer is different from a fourth distance between the fourth sidewall and the second top channel layer.

* * * * *